US007474041B2

(12) United States Patent
Ketterling et al.

(10) Patent No.: US 7,474,041 B2

(45) Date of Patent: Jan. 6, 2009

(54) SYSTEM AND METHOD FOR DESIGN AND FABRICATION OF A HIGH FREQUENCY TRANSDUCER

(75) Inventors: Jeffrey A. Ketterling, New York, NY (US); Frederic L. Lizzi, Tenafly, NJ (US); Mary Lizzi, legal representative, Tenafly, NJ (US)

(73) Assignee: Riverside Research Institute, New York, NY (US)

( * ) Notice: Subject to any disclaimer, the term of this patent is extended or adjusted under 35 U.S.C. 154(b) by 0 days.

(21) Appl. No.: 12/102,517

(22) Filed: Apr. 14, 2008

(65) Prior Publication Data

US 2008/0185937 A1 Aug. 7, 2008

Related U.S. Application Data

(62) Division of application No. 11/136,223, filed on May 24, 2005, now Pat. No. 7,356,905.

(60) Provisional application No. 60/574,094, filed on May 25, 2004.

(51) Int. Cl.
*H01L 41/18* (2006.01)

(52) U.S. Cl. .................................................... 310/800

(58) Field of Classification Search .................. 310/800
See application file for complete search history.

(56) References Cited

U.S. PATENT DOCUMENTS 4,385,255 A 5/1983 Yamaguchi et al.
4,441,503 A 4/1984 O'Donnell
4,516,112 A * 5/1985 Chen .......................... 341/34
4,517,665 A * 5/1985 DeReggi et al. ............ 367/163
4,537,074 A 8/1985 Dietz
4,676,106 A 6/1987 Nagai et al.
4,815,047 A 3/1989 Hart
4,833,659 A * 5/1989 Geil et al. .................. 367/155
4,888,861 A 12/1989 Day
5,030,874 A 7/1991 Saito et al.
5,115,810 A 5/1992 Watanabe et al.
5,122,993 A 6/1992 Hikita et al.
5,291,090 A 3/1994 Dias
5,296,777 A 3/1994 Mine et al.
5,410,205 A 4/1995 Gururaja (Continued)

OTHER PUBLICATIONS

Brown et al., Design and Fabrication of Annular Arrays for High-Frequency Ultrasound, IEEE, Transactions on Ultrasonics, Ferroelectrics and Frequency Control, vol. 51, No. 8, pp. 1010-1017, Aug. 2004.

(Continued)

*Primary Examiner*—Thomas M Dougherty
(74) *Attorney, Agent, or Firm*—Keith D. Nowak; Carter Ledyard & Milburn LLP

(57) ABSTRACT

Techniques for fabricating high frequency ultrasound transducers are provided herein. In one embodiment, the fabrication includes depositing a copperclad polyimide film, a layer of epoxy on the copperclad polyimide film, and a polyvinylidene fluoride film on the epoxy. The assembly of materials are then pressed to bond the polyvinylidene fluoride film to the copperclad polyimide film and to form an assembly. The polyvinylidene fluoride film being one surface and the copperclad polyimide film being the other surface. The area behind the copperclad polyimide film surface is filled with a second epoxy, and then cured to form an epoxy plug.

11 Claims, 5 Drawing Sheets

U.S. PATENT DOCUMENTS

| | | | | |
|---|---|---|---|---|
| 5,465,725 | A | 11/1995 | Seyed-Bolorforosh | |
| 5,520,188 | A | 5/1996 | Hennige et al. | |
| 5,823,962 | A | 10/1998 | Schaetzle et al. | |
| 5,905,692 | A | 5/1999 | Dolazza et al. | |
| 5,945,770 | A | 8/1999 | Hanafy | |
| 5,964,709 | A | 10/1999 | Chiang et al. | |
| 6,155,982 | A | 12/2000 | Hunt | |
| 6,333,590 | B1 | 12/2001 | Izumi | |
| 6,551,247 | B2 | 4/2003 | Saiti et al. | |
| 6,622,562 | B2 | 9/2003 | Angelsen et al. | |
| 2002/0139193 | A1 | 10/2002 | Angelsen et al. | |
| 2004/0122319 | A1 | 6/2004 | Mehi et al. | |
| 2004/0143187 | A1 | 7/2004 | Biagi et al. | |
| 2005/0281995 | A1 * | 12/2005 | Murai et al. | 428/209 |

OTHER PUBLICATIONS

Ritter et al., A 30-MHz Piezo-Composite Ul;trasound Array for Medical Imaging Applications, IEEE, Transactions on Ultrasonics, Ferroelectrics and Frequency Control, vol. 49, No. 2, pp. 217-230, Feb. 2002.

Snook et al., Design of a 50 MHz Annular Array Using Fine-Grain Lead Titanate, pp. 91-98, 2002, PA, USA.

Alves et al., High Frequency Single Element and Annular Array Transducers Incorporating PVDF, Medical Imaging, vol. 3982, pp. 116-121, 2000.

Foster et al., A History of Medical and Biological Imaging with Polyvinylidene Fluoride (PVDF) Transducers, IEEE, Transactions on Ultrasonics, Ferroelectrics and Frequency Control, vol. 47, No. 6, pp. 1363-1371, Nov. 2000.

Lockwood et al., Fabricating of High Frequency Spherically Shaped Ceramic Transducers, IEEE, Transactions on Ultrasonics, Ferroelectrics and Frequency Control, vol. 41, No. 2, pp. 231-235, Mar. 2004.

Saito et al., P(VDF-TrFE) Transducer With a Concave Annular Structure For The Measurement of Layer Thickness, IEEE, Transactions on Ultrasonics, Ferroelectrics and Frequency Control, vol. 40, No. 1, pp. 34-40, Jan. 1993.

Sherar et al., The Design and Fabrication of High Frequency Polyvinylidene Fluoride Transducers, Ultrasonic Imaging 11, 75-94, pp. 75-94, 1989.

* cited by examiner

SYSTEM AND METHOD FOR DESIGN AND FABRICATION OF A HIGH FREQUENCY TRANSDUCER

CROSS-REFERENCE TO RELATED APPLICATIONS

This application is a divisional of U.S. patent application Ser. No. 11/136,223, filed on May 24, 2005, entitled "Method of Fabricating a High Frequency Ultrasound Transducer," which claims priority to U.S. Provisional Patent Application No. 60/574,094, filed on May 25, 2004, entitled "Design and Fabrication of a 40-MHZ Annular Array Transducer," which is hereby incorporated by reference in its entirety.

FIELD OF INVENTION

The present invention is directed to design and fabrication of high frequency ultrasound annular array transducers.

BACKGROUND OF THE INVENTION

The field of high-frequency ultrasound ("HFU") imaging, using frequencies above 20 MHz, is growing rapidly as transducer technologies improve and the cost of high bandwidth electronic instrumentation decreases. Single element focused transducers, however, are currently used for most HFU applications. These single element transducers are limited in their application due to their inherent small depth of field, which limits the best image resolution to a small axial range close to the geometric focus of the transducer.

HFU transducers primarily utilize single element focused transducers fabricated with polyvinylidene fluoride ("PVDF") membranes as their active acoustic layer. These transducers are relatively simple to fabricate but suffer from a fairly high two-way insertion loss (≈40 dB) because of the material properties of PVDF. As a result, methods have focused on improving the insertion loss by optimizing the drive electronics and electrical matching. Single element PVDF transducers continue to be the primary transducer choice for HFU applications and have been fabricated using a ball-bearing compression method.

Similarly, methods of fabricating single element HFU transducers using ceramic material have been refined. A number of ceramic devices have been fabricated successfully to operate in the HFU regime. Ceramic devices have an inherent advantage over PVDF based transducers because of their low insertion loss. Ceramic materials, however, are typically used for flat arrays because they are difficult to grow or to press into curved shapes. Fabricating HFU ceramic transducers into concave shapes is known in the art through the use machining, coating, lapping, laminating and/or heat forming techniques for bonding and shaping curved transducers. These known fabrication techniques are used to construct single element transducers, and are not used to construct an array transducer.

Both PVDF and ceramic transducers have been used to great success for ophthalmic, dermatological, and small animal imaging. Current methods aim to fabricate individual array elements on the order of $\lambda/2$; these small dimensions necessitate advances in interconnects and electronics to fully implement the technologies. Accordingly, there exists a need for a technique for the feasible design and fabrication of a high frequency annular array transducer.

BRIEF SUMMARY OF THE INVENTION

It is an object of the present invention to provide a HFU transducer with large bandwidth, providing fine scale axial resolution, and small lateral beamwidth, which permits imaging with resolution on the order of a wavelength. An array transducer permits electronic focusing that both improves the depth of field of the device and permits a two-dimensional image to be constructed, and with a relatively limited number of elements.

It is a further object of the present invention to construct, bond, and form a concave annular array transducer out of an active piezoelectric material, polyimide film, and epoxy using a ball-bearing compression method.

It is yet another object of the present invention that the active piezoelectric material of the transducer can be polyvinylidene fluoride ("PVDF"). PVDF is an advantageous material for fabricating high frequency transducers because the material can be press fit into a curved shape. PVDF also provides a better acoustic impedance match to water and biological tissue.

It is a further object of the present invention to demonstrate the feasibility of a new method to construct PVDF based annular arrays.

In order to meet these objects and others that will become apparent with respect to the disclosure herein, the present invention provides techniques for fabricating high frequency ultrasound multiple ring focused annular array transducers. In one embodiment, the fabrication includes depositing a copperclad polyimide film, a layer of epoxy on the copperclad polyimide film, and a PVDF film on the epoxy. The assembly of materials are then pressed to bond the polyvinylidene fluoride film to the copperclad polyimide film, and to form an assembly. The PVDF film being one surface and the copperclad polyimide film being the other surface. The area behind the copperclad polyimide film surface is filled with a second epoxy, and then cured to form an epoxy plug.

Advantageously, the active acoustic element of the transducer is a PVDF film with one side coated in gold and acting as the ground plane. A positive array pattern of the transducer is formed on a copper clad polyimide film ("flex circuit"). The flex circuit and PVDF are bonded together, press fit into a spherical shape, and then back filled with epoxy. Transducer performance can be characterized by measuring pulse/echo response, two-way insertion loss, electrical cross talk, and the complex electrical impedance of each array element before and after complex impedance matching.

DETAILED DESCRIPTION OF THE INVENTION

Figure 1:
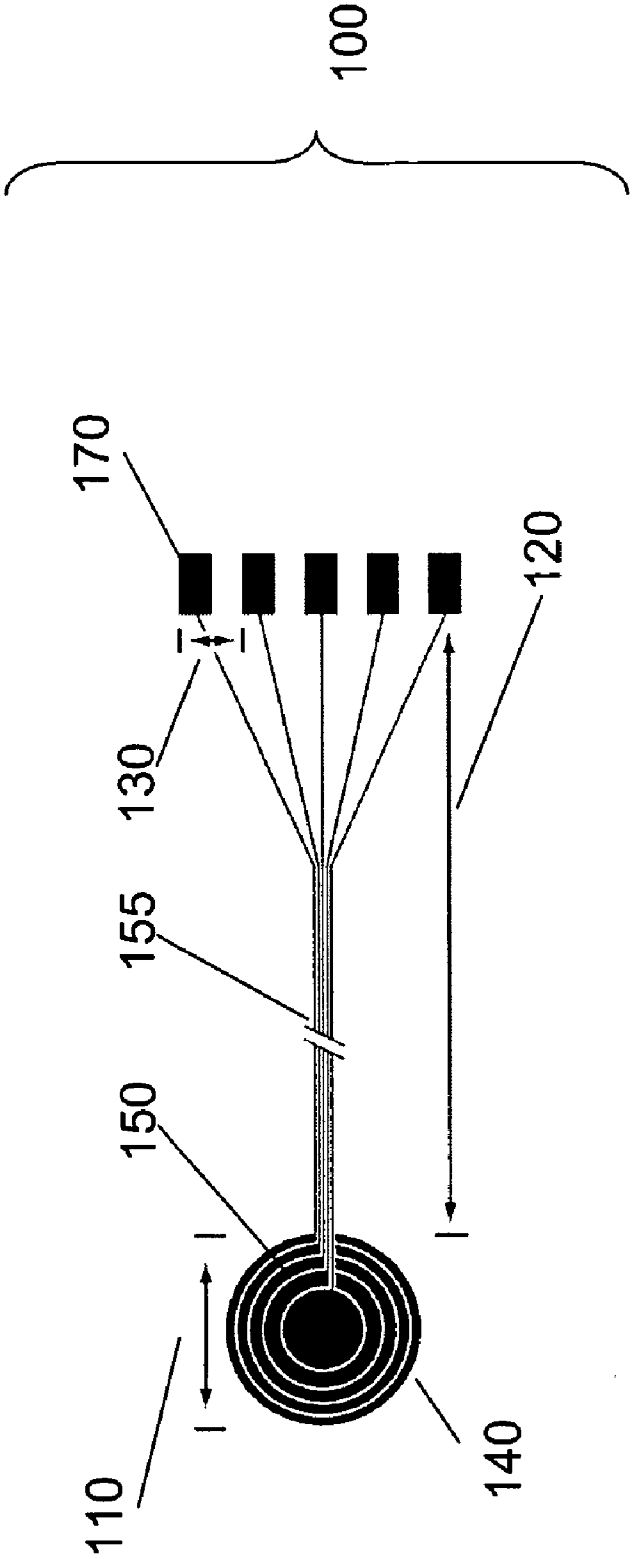
FIG. 1 is a schematic diagram which illustrates a positive array pattern of a high frequency annular array transducer.

Referring to FIG. 1, an exemplary positive array pattern of a transducer is shown. The circuit patterns are designed as positive images with a computer-aided design ("CAD") software package. QuickCAD is used in a preferred embodiment, which is commercially available from Autodesk Inc. The transducer has an aperture 110 with a number of equal area rings, known as annuli 140, and separated by a designated annuli spacing 150 between the annuli 140. In a preferred embodiment, the transducer has a total aperture of 9 mm with five equal area rings separated by 100 μm spacings. Transducer electrical traces 155 permit access to each annulus, and can have the same designated spacing as the annuli spacing 150 between the annuli 140. In a preferred embodiment, the electrical traces that permit access to each annulus and the spacing between the traces are 100 μm.

From the CAD file, a transparent film with a positive array image is generated by a commercial offset print shop. This method of creating the positive image permits line widths and spacings of smaller than 100 μm.

The array pattern 100 is formed on a material commonly used to fabricate flex circuits, such as for example, single sided copper clad polyimide film. In a preferred embodiment, the single sided copper clad polyimide film is RFlex 1000L810, which is commercially available from Rogers Corp. located in Chandler, Ariz. or any equivalent supplier. In the preferred embodiment, the polyimide film is 25-μm thick, the copper is 18-μm thick, and an adhesive layer bonding the copper to the polyimide is 20-μm thick. Before creating the array pattern 100, the polyimide is coated with a uniform thickness of positive photoresist, which is commercially available from Injectorall located in Bohemia, N.Y. or any equivalent supplier.

The copper array pattern 100 is fabricated onto the flex circuit using standard copper etching techniques. In a preferred embodiment, the positive array image is placed on top of the photoresist coated polyimide and exposed to ultraviolet ("UV") light for 2-3 minutes in a UV fluorescent exposure unit, which is commercially available from AmerGraph located in Sparta, N.J. or any equivalent supplier. The polyimide is then transferred to a liquid developer, which removes the photoresist that is exposed to UV light. The developed film is agitated in a ferric chloride bath until all the copper in the areas lacking photoresist are etched away.

Once the array pattern 100 is fabricated, a microscope can be used to view the finished array pattern 100 to ensure that the line widths and spacings between the transducer electrical traces 155 are uniform and of the correct size. After removing the remaining photoresist, which can be done with steel wool or with acetone, the array pattern 100 should be tested for electrical continuity between the annuli 140 and copper contact pads 170. Test patterns are used to ensure correct line width spacing for both annuli spacing 150 and transducer electrical traces 155. And in a preferred embodiment, test patterns are utilized to ensure 100 μm spacing for both the ring separations and line widths.

Figure 2:
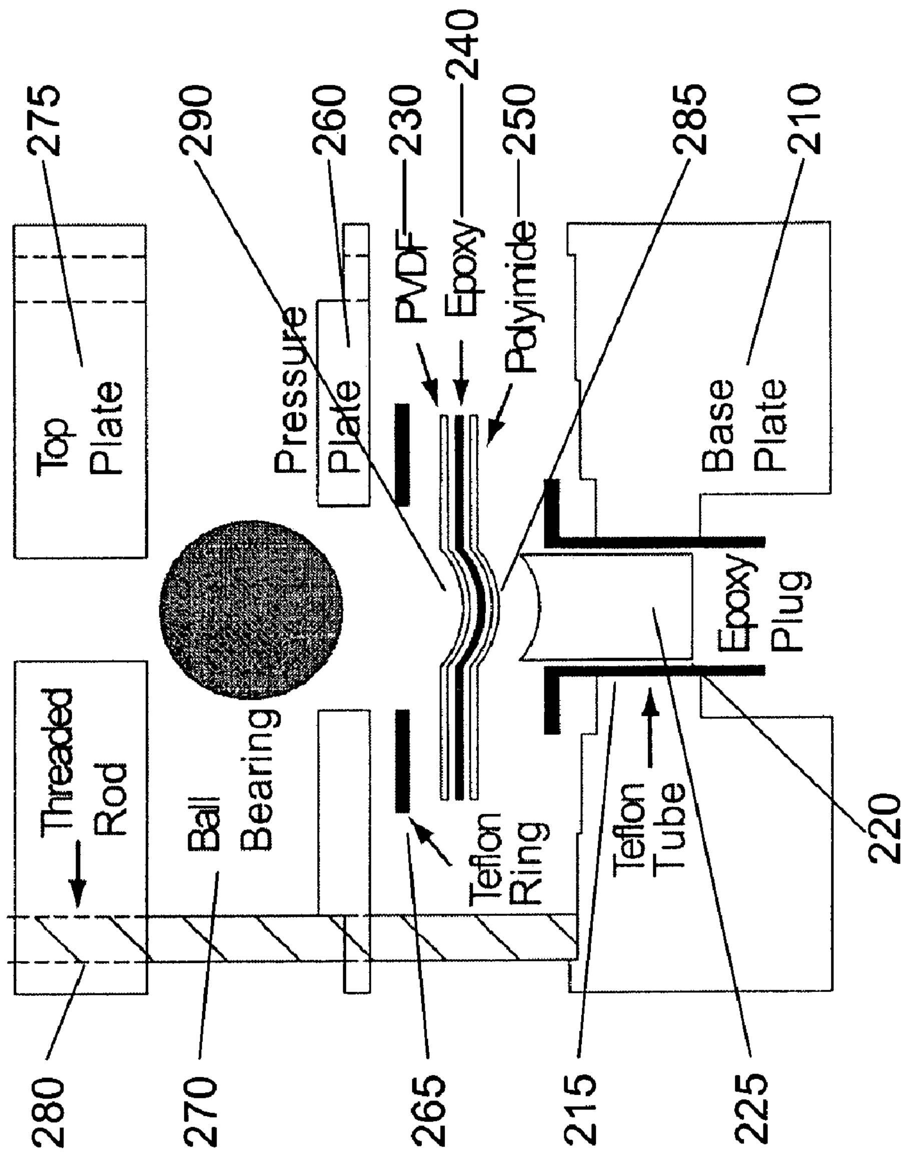
FIG. 2 is an assembly view which illustrates a press fit device used to assemble a high frequency annular array transducer.

Referring to FIG. 2, an annular array transducer is assembled using a press fit device and layers of material using compression to bond and form the assembly into a concave shape. In a preferred embodiment, the press fit device is constructed of aluminum. The press fit device shown in FIG. 2 uses a base plate 210, a pressure plate 260, and a ball bearing 270 to apply uniform pressure to a polyvinylidene fluoride ("PVDF") film 230, epoxy 240, and copperclad polyimide film 250. A top plate 275 presses the ball bearing 270 into the PVDF 230, epoxy 240, and copperclad polyimide 250 assembly. The base plate 210 has a central hole 220 in which a tube 215 is inserted. In an preferred embodiment, the tube 215 is made of Teflon and the ball bearing 270 is made of stainless steel.

Assembly of the transducer begins by inserting a tube 215 into a baseplate 210. A polyimide film 250, on which an array pattern 100 is fabricated, is centered over the tube 215 with the copper side facing in a direction opposite to that of the base plate 210, shown facing in the upward direction. An epoxy layer 240 is deposited onto the copperclad polyimide film 250 and array pattern. As used herein, "epoxy" is understood as including any resinous bonding agent. In a preferred embodiment, a single drop of Hysol RE2039 or HD3561 epoxy, which is commercially available from Loctite Corp. located in Olean, N.Y., is placed onto the array pattern. A PVDF film 230 is then deposited on the epoxy 240. In a preferred embodiment, a 4 cm by 4 cm section of PVDF membrane, such as that commercially available from Ktech Corp. located in Albuquerque, N. Mex. or any equivalent supplier, is placed over the epoxy. The PVDF can be 9 μm thick and have one side metallized with gold, where the metallized side forms a ground plane of the transducer and should face in a direction opposite to that of the epoxy 240. A ring 265 is placed over or on top of the PVDF film 230, and clamped with a pressure plate 260. The pressure plate permits the layers of material to move slightly while also stretching during the press fit, thus avoiding crinkling of the films at the edge of the transducer. In a preferred embodiment, the ring 265 can be made of Teflon.

A ball bearing 270 is pressed into the PVDF film 230 by applying pressure to a top plate 275 that is in contact with the ball bearing 270. In a preferred embodiment, the ball bearing 270 is made of stainless steel and has an outside diameter of 18 mm. The PVDF film 230 and the copperclad polyimide film 250 are bonded together with the epoxy 240, and formed to have a spherically curved shape comprising a concave surface 290 and a convex surface 285. After compression, epoxy is deposited in the tube 215, such that a plug of epoxy 225 fills the area behind the convex surface 285 of the copperclad polyimide film 250. The assembly can then be placed into a vacuum chamber to ensure bubbles are not present on the backside of the copperclad polyimide film 250. In a preferred embodiment, the press fit device is turned over and the Teflon tube is filled with epoxy. The whole press fit device is then placed into a vacuum chamber at approximately 8 Torr. The degassing lasts as long as necessary to ensure that no bubbles are present on the backside of the polyimide, which is approximately 40 minutes.

In an exemplary embodiment, the epoxy plug has an outside diameter of 13 mm, while the active array has an outside diameter of 6 mm. The wider epoxy plug ensures a more spherically curved transducer face and avoids crinkles at the edge of the transducer.

Figure 3:
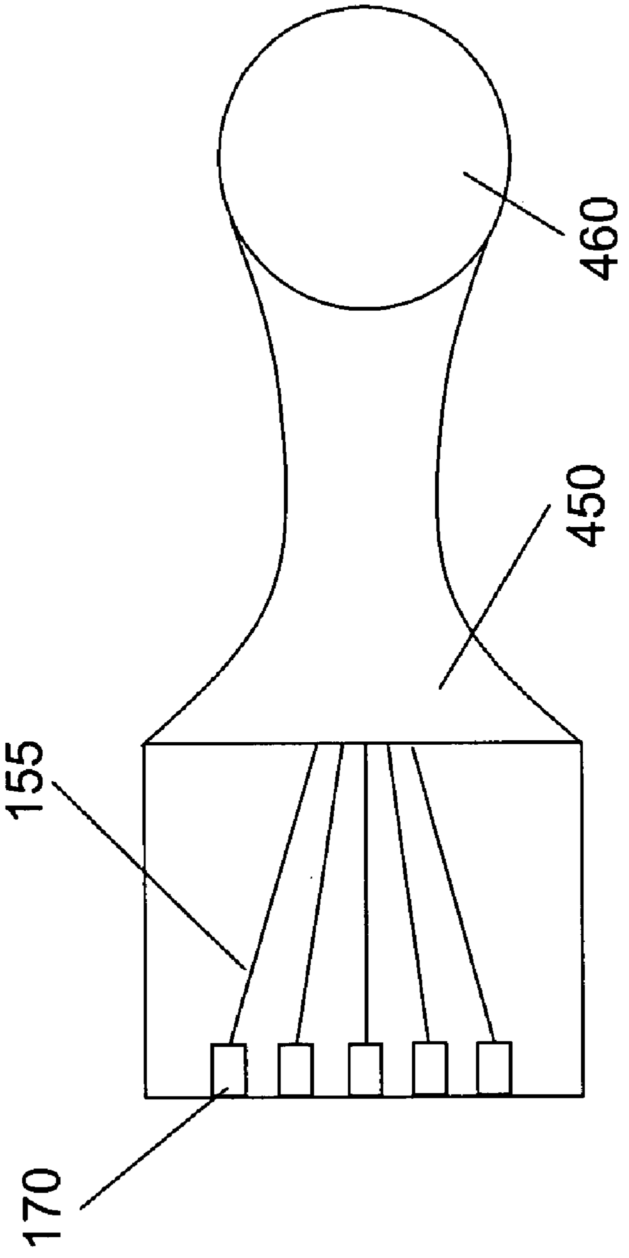
FIG. 3 is a plan view which illustrates the electrical traces and contact pads of the positive array pattern portion of the high frequency annular array transducer.

After degassing, cure time of the epoxy plug 225 can be reduced by placing the assembled transducer into an oven. In a preferred embodiment, after the degassing process the press fit device is moved into a 40 degree Celsius oven to reduce the epoxy cure time. When the epoxy cures, the transducer is separated from the tube 215. The resultant transducer assembly includes an epoxy plug 225 bonded to the convex surface 285 of the copperclad polyimide film 250. Referring to FIG. 3, the electrical traces and their contact pads remain exposed by trimming away any excess material.

Figure 5:
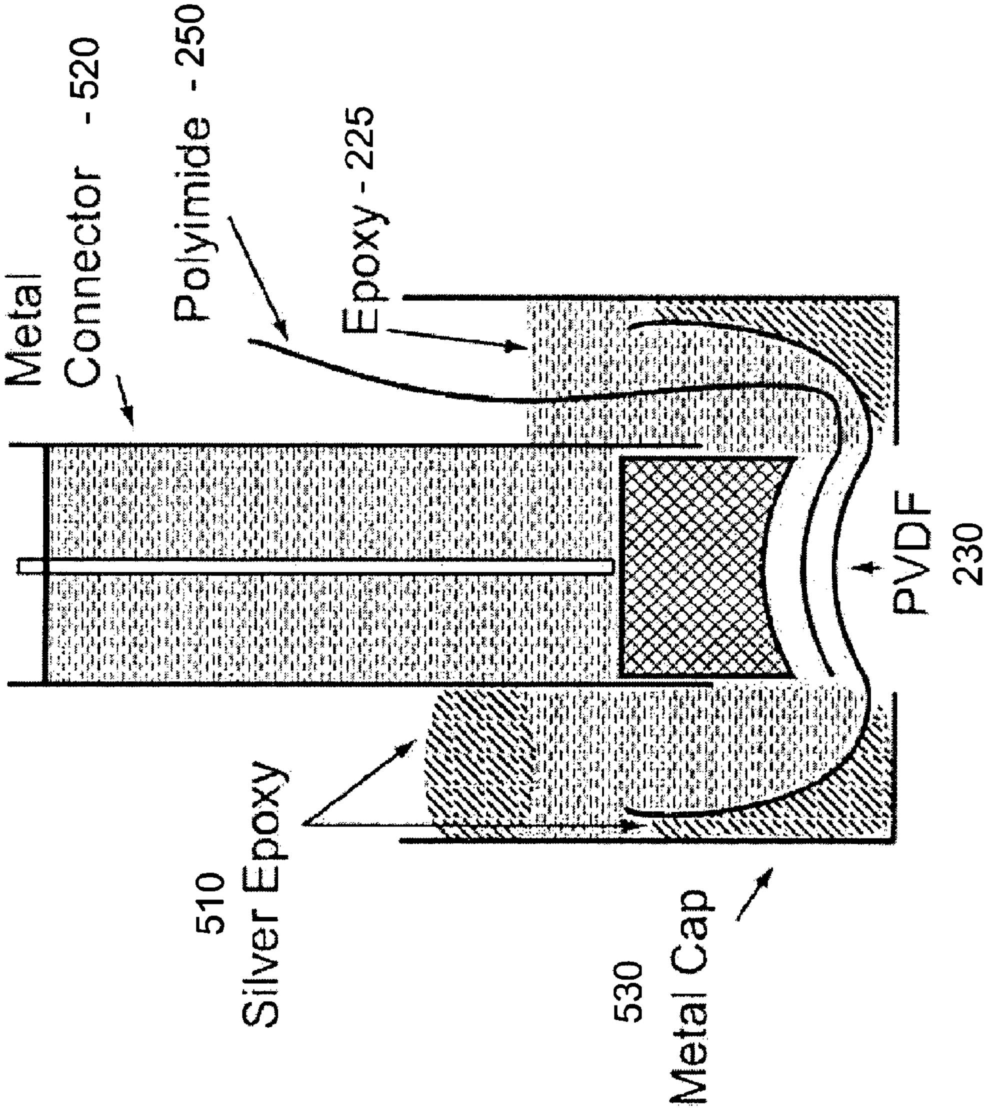
FIG. 5 is an assembly view which illustrates a high frequency transducer.

FIG. 5 illustrates an exemplary embodiment, where an epoxy 510, such as silver epoxy EE129-4 which is commercially available from Epoxy Technology located in Billerica, Mass. or any equivalent supplier, is used to join the conductive side of the PVDF film 230 to a ground connection via the metal cap 530 and metal connector 520. The metal cap 530 and metal connector can comprise two separate units, or be constructed as a single unit. In an alternative embodiment, the ground connection can also be made by joining the conductive side of the PVDF film to ground traces on the polyimide.

Figure 4:
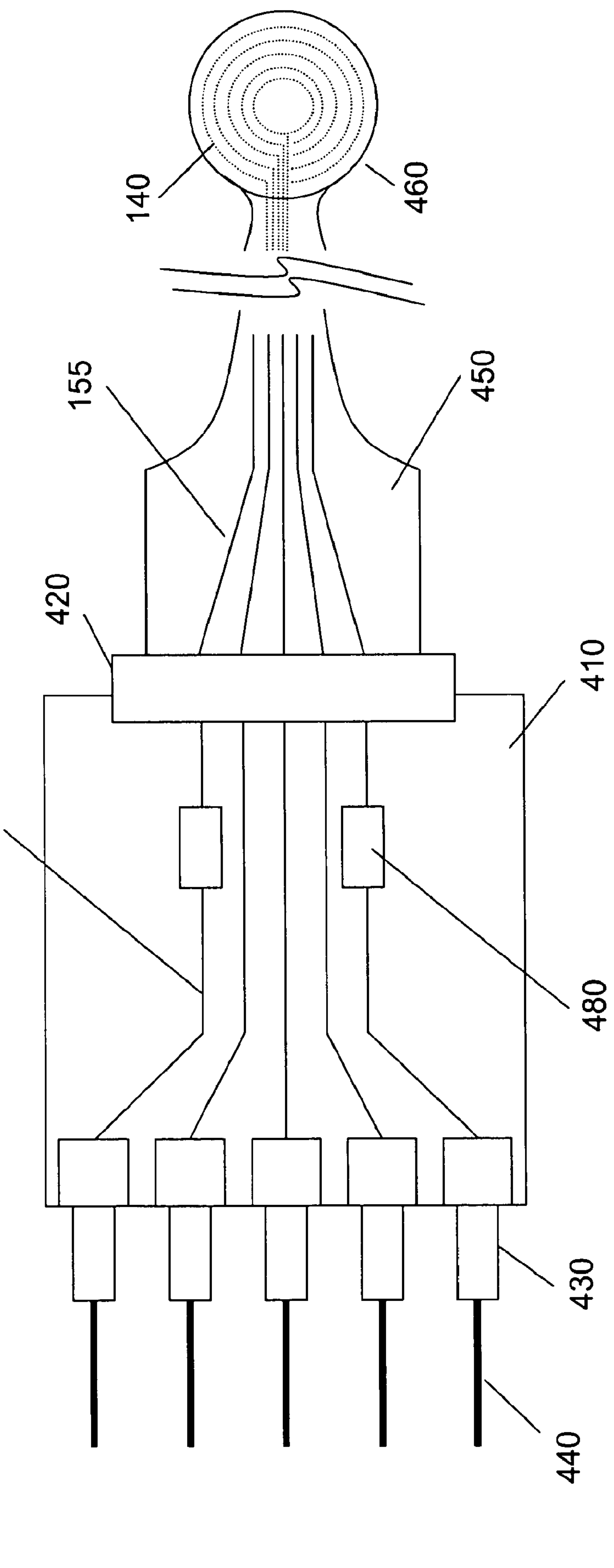
FIG. 4 is a plan view which illustrates electronic access to the transducer annuli through a customized printed circuit board connected to the array pattern of the transducer.

Referring to FIG. 4, in order to electronically access the annuli 140, a customized printed circuit board ("PCB") 410 can be fabricated to enable electronic access to the annuli 140 through the printed circuit board traces 470. The PCB 410 has a connector 420 on one side and a series of smaller connectors 430 on the opposing side. Cables 440 are connected to each of the smaller connectors 430. An additional advantage of the PCB 410 is that surface mount inductors 480 can be soldered directly onto the PCB 410 for impedance matching. The inductors shown in FIG. 4 are connected in series to the printed circuit board traces 470, but can also be in parallel to the printed circuit board traces 470. A mounting bracket made from aluminum rod can hold the transducer 460 and PCB 410. The polyimide film 450 is then wrapped around and inserted into the connector 420. Thus, the PCB 410 enables electronic access from the cables 440 to the PCB traces 470 through a series of connectors 430. The PCB traces 470 are electronically connected to the transducer electrical traces 155 through a connector 420. The transducer electrical traces 155 are electronically connected to the annuli 140.

In a preferred embodiment, the first connector 420 is a 20-pin zero insertion force ("ZIF") connector, which is commercially available from Hirose Electric located in Simi Valley, Calif. or any equivalent supplier. The smaller connectors 430 are miniature MMCX-BNC connectors, which are commercially available from Amphenol or any equivalent supplier. The Cables 440 are BNC cables, such as RG-174 50 Ohms of 0.87 meters length.

In an exemplary embodiment, prior to applying the press fit technique described above, an adhesive material such as tape can be applied to the electrical traces located on the polyimide film. This prevents the epoxy from adhering to the polyimide films, allowing the polyimide film to flex after the fabrication process without breaking the electrical traces. Similarly, an adhesive material such as tape can be placed on the polyimide traces leading out to the ZIF connector's contact pads, and removed subsequent to fabrication. The polyimide film is held in position with an adhesive material such as tape and centered over the Teflon ring. The adhesive material is removed after the pressure plate is secured but before the press fit is applied. Once the top plate is secured and the ball bearing has been pressed into the assembly, the screws holding the pressure plate can be loosened. A copper conductive adhesive material such as copper conductive tape is positioned on the backside of the PCB in order to form a ground plane and reduce electrical noise.

In a preferred embodiment, the results from a piezoelectric transducer modeling software package, such as PiezoCAD that is commercially available from Sonic Concepts located in Woodinville, Wash. or any equivalent supplier, is used to determine the best impedance matching for maximizing the two-way pulse/echo response. Based on the model results, an appropriate surface mount inductor is selected and soldered directly onto the PCB board. The complex impedance can again be measured to ensure that the reactance at the center frequency is in fact zero. Impedance matching eliminates the complex component at a desired frequency for better transducer efficiency.

In an exemplary embodiment, a 5-ring annular array transducer is fabricated with equal area elements and 100 μm spacing between the annuli. The total transducer aperture is 9 mm and the radius of curvature is also 9 mm. The inner and outer radii of the annuli when projected onto a plane are 0, 1.95, 2.05, 2.81, 2.90, 3.47, 3.56, 4.02, 4.11 and 4.50 mm. The projected spacings between elements can sometimes be slightly less than 100 μm because the initial pattern is designed as a planar layout and then press fit into a spherical curvature.

In an exemplary embodiment, impedance measurements are made of each annulus in order to determine the most efficient electrical matching. Based on piezoelectric transducer modeling, the transducer capacitance is matched with an inductor connected in parallel and located on the PCB. Parallel inductance is selected because it results in a larger improvement for the two-way insertion loss but with a decrease in bandwidth. All of the array elements can utilize the same matching inductance. When using a single matching inductance, however, the frequency at which the matched reactance occurs can vary somewhat for each ring. In a preferred embodiment, a value of 0.33 μH is calculated as the best matching at 40 MHz. In the ideal case the reactive component for each ring should be zero at 40 MHz.

In an exemplary embodiment, the total transducer aperture can be 6 mm with a geometric focus of 12 mm. In this embodiment, the inner and outer radii of the annuli when projected onto a plane are 0, 1.22, 1.32, 1.8, 1.9, 2.26, 2.36, 2.65, 2.75 and 3.0 mm. In this arrangement, the transducer capacitance is matched with an inductor connected in series and located on the PCB. The inductor value of 0.82 μH is calculated as the best matching at 40 MHz.

Impedance matching may also increase the pulse/echo response for the same excitation signal. An increase in pulse/echo sensitivity can be achieved at the cost of reduced bandwidth. Impedance matching also improves the two-way insertion loss over the unmatched case.

PVDF based annular arrays can be constructed using a copper clad polyimide film to form the array electrode pattern. After impedance matching, the performance of the array elements should be similar to what has been reported for single element PVDF transducers.

Those of ordinary skill in the art will appreciate that the foregoing discussion of certain embodiments and preferred embodiments are illustrative only, and does not limit the spirit and scope of the present invention, which is limited only by the claims set forth below.

The invention claimed is:

1. A high frequency ultrasound transducer device, comprising: a copperclad polyimide film; a layer of epoxy bonded to a first surface of said copperclad polyimide film; a polyvinylidene fluoride film bonded to said layer of epoxy on a first side thereof to thereby form an assembly; and a second epoxy bonded to a second surface of said copperclad polyimide film surface to fabricate into said high frequency ultrasound transducer.

2. The device of claim 1, wherein said polyvinylidene fluoride film bonded to said copperclad polyimide film having a curved shape, wherein said polyvinylidene fluoride film being a concave surface thereof and said copperclad polyimide film being a convex surface thereof.

3. The device of claim 2, wherein said curved shape is spherically curved.

4. The device of claim 1, wherein an array pattern is formed on said copperclad polyimide film and said arrays are electronically connected to transducer electrical traces.

5. The device of claim 4, wherein said array pattern is an annular array pattern comprising a plurality of annuli.

6. The device of claim 5, wherein said plurality of annuli comprises five rings.

7. The device of claim 4, wherein printed circuit board traces are positioned on a printed circuit board and electronically connected to said transducer electrical traces allowing electronic access to said array pattern.

8. The device of claim 7, wherein surface inductors are mounted on said printed circuit board and connected to said printed circuit board traces for impedance matching.

9. The device of claim 1, wherein one side of said polyvinylidene fluoride film is coated in gold and acts as a ground plane.

10. The device of claim 1, wherein a third epoxy joins a conductive side of said polyvinylidene fluoride film to a metal cap and metal connector to form a ground connection.

11. The device of claim 10, wherein said third epoxy is a silver epoxy.

* * * * *

UNITED STATES PATENT AND TRADEMARK OFFICE
CERTIFICATE OF CORRECTION

PATENT NO. : 7,474,041 B2
APPLICATION NO. : 12/102517
DATED : January 6, 2009
INVENTOR(S) : Ketterling et al.

It is certified that error appears in the above-identified patent and that said Letters Patent is hereby corrected as shown below:

In the Specification

Column 1, line 21, under [Background of the Invention], first paragraph, beginning of first sentence, should be added as follows:

This invention was made with government support under Grants R03 EY014371 and R01 EB008606 awarded by the National Institutes of Health. The government has certain rights in the invention.

Signed and Sealed this
Fifteenth Day of July, 2014

Michelle K. Lee
*Deputy Director of the United States Patent and Trademark Office*